(12) United States Patent
Jang et al.

(10) Patent No.: US 10,489,537 B2
(45) Date of Patent: Nov. 26, 2019

(54) METHOD FOR SIMULATING EVENT-DRIVEN SWITCHING CIRCUIT AND SAVING MEDIUM TO WHICH CIRCUIT SIMULATION PROGRAM USING SAME IS SAVED

(71) Applicant: SNU R&DB FOUNDATION, Seoul (KR)

(72) Inventors: Ji Eun Jang, Seoul (KR); Jae Ha Kim, Seoul (KR)

(73) Assignee: SNU R&DB FOUNDATION, Seoul (KR)

( * ) Notice: Subject to any disclaimer, the term of this patent is extended or adjusted under 35 U.S.C. 154(b) by 710 days.

(21) Appl. No.: 14/781,561

(22) PCT Filed: Feb. 7, 2013

(86) PCT No.: PCT/KR2013/000974
§ 371 (c)(1),
(2) Date: Sep. 30, 2015

(87) PCT Pub. No.: WO2014/123258
PCT Pub. Date: Aug. 14, 2014

(65) Prior Publication Data
US 2016/0048621 A1  Feb. 18, 2016

(51) Int. Cl.
*G06F 17/50* (2006.01)
*G06F 17/10* (2006.01)

(52) U.S. Cl.
CPC .......... *G06F 17/5036* (2013.01); *G06F 17/10* (2013.01)

(58) Field of Classification Search
CPC .............. G06F 17/5036; G06F 17/10
(Continued)

(56) References Cited

U.S. PATENT DOCUMENTS 3,973,112 A * 8/1976 Sloane ................ G01M 7/022
702/111
5,404,319 A * 4/1995 Smith ................ G06F 17/5036
716/103
(Continued)

FOREIGN PATENT DOCUMENTS

| KR | 10-2001-0038591 A | 5/2001 |
| KR | 10-2008-0013677 A | 2/2008 |
| KR | 10-2011-0022790 A | 3/2011 |

OTHER PUBLICATIONS

"Verilog-AMS Language Reference Manual." Accellera, version 2.3 (2008) (Year: 2008).*
(Continued)

*Primary Examiner* — Kamini S Shah
*Assistant Examiner* — Iftekhar A Khan
(74) *Attorney, Agent, or Firm* — Morgan, Lewis & Bockius LLP (57) ABSTRACT

Disclosed is a method of simulating a switching electrical circuit, including one or more reactive elements and one or more switches. The method includes receiving an electrical circuit including one or more reactive elements and one or more switches and a stimulus expressed in a form of a linear combination of one or more basis functions; calculating a response of the electrical circuit before the switching in a form of a linear combination of one or more basis functions, using an s-domain transfer function of the electrical circuit before the switching, initial values of the reactive elements before the switching, and the stimulus expressed in a form of a linear combination of one or more basis functions; and calculating a response of the electrical circuit after the switching in a form of a linear combination of one or more basis functions, using an s-domain transfer function of the
(Continued)

electrical circuit after the switching and initial values of the reactive elements after the switching.

21 Claims, 6 Drawing Sheets

(58) Field of Classification Search
USPC .................................................. 703/2
See application file for complete search history.

(56) References Cited

U.S. PATENT DOCUMENTS

| | | | | | |
|---|---|---|---|---|---|
| 5,689,685 | A * | 11/1997 | Feldmann | ........... | G06F 17/5036 703/2 |
| 5,937,158 | A * | 8/1999 | Uranaka | ............ | G06Q 30/0621 726/4 |
| 6,016,445 | A * | 1/2000 | Baura | .................. | A61N 1/3943 324/607 |
| 6,088,523 | A * | 7/2000 | Nabors | ............... | G06F 17/5036 703/14 |
| 6,498,498 | B1 * | 12/2002 | Menezes | ................ | G01R 29/26 324/613 |
| 6,530,065 | B1 * | 3/2003 | McDonald | .......... | G06F 17/5036 716/102 |
| 7,441,219 | B2 * | 10/2008 | Perry | .................. | G06F 17/5045 703/16 |
| 7,475,000 | B2 * | 1/2009 | Cook | ................. | G06F 17/5045 703/13 |
| 7,542,887 | B2 * | 6/2009 | Brughmans | ......... | G06F 17/5018 703/2 |
| 8,185,853 | B2 * | 5/2012 | Kim | .................... | G06F 17/5036 703/16 |
| 8,219,374 | B1 * | 7/2012 | Batarseh | ............... | G06F 3/0483 703/13 |
| 8,489,666 | B1 * | 7/2013 | Nikitin | ................. | G06G 7/1928 708/819 |
| 9,009,640 | B1 * | 4/2015 | Atcitty | ................ | G06F 17/5036 716/100 |
| 2003/0083856 | A1 * | 5/2003 | Yoshimura | .......... | G06F 17/5036 703/18 |
| 2005/0015235 | A1 * | 1/2005 | Maeda | ................ | G06F 17/5036 703/15 |
| 2005/0027491 | A1 * | 2/2005 | Fertner | ............... | G06F 17/5036 702/196 |
| 2005/0154315 | A1 * | 7/2005 | Nair | .................... | A61B 5/02007 600/467 |
| 2007/0250559 | A1 * | 10/2007 | Dhaene | ............... | G06F 17/5036 708/490 |
| 2007/0294048 | A1 * | 12/2007 | Nagata | ................ | G06F 17/5036 702/117 |
| 2008/0086668 | A1 * | 4/2008 | Jefferson | ............ | G01R 31/2848 714/741 |
| 2008/0288201 | A1 * | 11/2008 | Oettinger | .............. | H02M 3/157 702/109 |
| 2010/0066442 | A1 * | 3/2010 | Mu | .................... | H03H 11/1291 327/553 |
| 2010/0280801 | A1 * | 11/2010 | Deschrijver | ........ | G06F 17/5036 703/2 |
| 2012/0119811 | A1 * | 5/2012 | Bai | ....................... | H03F 1/3247 327/317 |
| 2012/0331431 | A1 * | 12/2012 | Batarseh | ............... | G06F 3/0483 716/102 |
| 2013/0085726 | A1 * | 4/2013 | Habitz | ................ | G06F 17/5036 703/2 |
| 2016/0048620 | A1 * | 2/2016 | Jang | .................... | G06F 17/5036 703/2 |
| 2016/0048621 | A1 * | 2/2016 | Jang | ........................ | G06F 17/10 703/2 |

OTHER PUBLICATIONS

Karris, S. "Signals and Systems with MATLAB Computing and Simulink Modeling." Edition 4, (2008), ISBN: 9781934404126, Chapter 4, pp. 4-1 to 4-35 (Year: 2008).*

Steven T. Karris ("Signals and Systems with MATLAB Computing and Simulink Modeling." Edition 4, (2008), ISBN: 9781934404126, Chapter 4, pp. 4-1 to 4-35) (Year: 2008).*

Trinchero et al. (Steady-State Response of Periodically Switched Linear Circuits via Augmented Time-Invariant Nodal Analysis, Journal of Electrical and Computer Engineering, 2014, pp. 1-12) (Year: 2014).*

Written Opinion of the International Searching Authority and International Search Report PCT/KR2013/000974 dated Nov. 26, 2013 with English translation.

* cited by examiner

METHOD FOR SIMULATING EVENT-DRIVEN SWITCHING CIRCUIT AND SAVING MEDIUM TO WHICH CIRCUIT SIMULATION PROGRAM USING SAME IS SAVED

CROSS-REFERENCE TO RELATED APPLICATIONS

This Application is the U.S. National Phase of PCT/KR2013/000974 filed Feb. 7, 2013, the subject matter of which is incorporated herein by reference in entirety.

TECHNICAL FIELD

The present invention relates to a method of simulating a switching circuit using an event-driven method and a recording medium storing a circuit simulation program using the method.

BACKGROUND ART

Most of the computer simulation tools widely in use for electrical circuits or systems, such as Simulation Program with Integrated Circuit Emphasis (SPICE) and MATLAB Simulink, express the continuous-time waveforms of voltage or current signals using a series of time-value pairs. In other word, each waveform is expressed using a set of discrete points each marking the signal value at a specific time. To compute such a waveform of the circuit or system in response to a certain stimuli, the ordinary differential equation governing the behavior of the circuit is typically solved using a numerical integration method such as trapezoidal method.

DISCLOSURE

Technical Problem

When finding a response of an electrical circuit using existing circuit simulation tools, the accuracy of the response and time required to obtain the response depend on the total time period of the response to be obtained and how finely the total time period is divided. For example, consider a case of expressing a unit-frequency sinusoidal waveform with a set of uniformly-spaced sample points. If the sample points are spaced at 100 millisecond intervals (i.e. ten samples per period), the resulting piecewise-linear waveform connecting these points would have too large a discrepancy error compared to the original sinusoidal waveform. Therefore, the time interval is only good for obtaining the approximate values of responses within a short time, but is not appropriate for obtain the accurate responses. On the other hand, if the sample points are spaced at 1 microsecond intervals (i.e. one million samples per period), the resulting waveform would be very close to the original waveform but the number of points required is large and the amount of time required to compute the points on the waveform would be long. In particular, when computer simulation tools employing an existing numerical integration method are used to simulate a switching circuit, the abrupt changes in the circuit configuration caused by the switching can degrade the simulation speed remarkably.

Such a result is due to the fact that the existing computer simulation tools do not calculate responses using an event-driven method but calculate responses using numerical integration methods which repeat calculation at determined time intervals. The event-driven method denotes a method in which the output is updated only when the input is changed. Therefore, if a response of an analog circuit is obtained using the event-driven method, it is possible to obtain an accurate response within a short time by calculating the output only when the input stimulus is changed.

The present invention is directed to providing a method of obtaining the response of an electrical circuit in which the switching operation of a switch occurs. The present invention is also directed to providing a method of obtaining an accurate response within a short time.

Technical Solution

One aspect of the present invention provides a method of simulating an electrical circuit, the method including: receiving an electrical circuit including one or more reactive elements and one or more switches, of which configurations change by switching any of the switches, and a stimulus expressed in a form of a linear combination of one or more basis functions; calculating a response of the electrical circuit before the switching in a form of a linear combination of one or more basis functions, using an s-domain transfer function of the electrical circuit before the switching, initial values of the reactive elements before the switching, and the stimulus expressed in a form of a linear combination of one or more basis functions; and calculating a response of the electrical circuit after the switching in a form of a linear combination of one or more basis functions, using an s-domain transfer function of the electrical circuit after the switching and initial values of the reactive elements after the switching.

Another aspect of the present invention provides a recording medium storing a program including: receiving an electrical circuit including one or more reactive elements and one or more switches, of which configurations change by switching any of the switches, and a stimulus expressed in a form of a linear combination of one or more basis functions; calculating a response of the electrical circuit before the switching in a form of a linear combination of one or more basis functions, using an s-domain transfer function of the electrical circuit before the switching, initial values of the reactive elements before the switching, and the stimulus expressed in a form of a linear combination of one or more basis functions; and calculating a response of the electrical circuit after the switching in a form of a linear combination of one or more basis functions, using an s-domain transfer function of the electrical circuit after the switching and initial values of the reactive elements after the switching.

Advantageous Effects

According to an exemplary embodiment, a response is found using s-domain transfer functions, and unlike in related art, a response is calculated not by using a numerical integration method but by using a circuit input by a user and a stimulus having the form of a linear combination of one or more basis functions. Therefore, in comparison with the related art, it is possible to calculate a response with high accuracy and within a short time.

MODE FOR INVENTION

Since embodiments of the present invention are intended to provide only a structural or functional description of the present invention, the scope of the present invention should not be interpreted as being limited to the embodiments described herein. In other words, the embodiments can be modified in various ways and have several forms, and thus it should be understood that the scope of the present invention includes equivalents capable of implementing the technical spirit of the present invention.

Meanwhile, the terminology used herein should be understood as follows.

Individual steps may be carried out according to an order different from a specified order unless clearly indicated otherwise. In other words, individual steps may be carried out in the same order as specified, substantially simultaneously, or in a reverse order.

Unless otherwise defined, all terms used herein have the same meaning as commonly understood by those of ordinary skill in the art to which the invention pertains. It will be further understood that terms, such as those defined in commonly used dictionaries, should be interpreted as having a meaning that is consistent with their meaning in the context of the related art and will not be interpreted in an idealized or overly formal sense unless clearly so defined herein.

Figure 1:
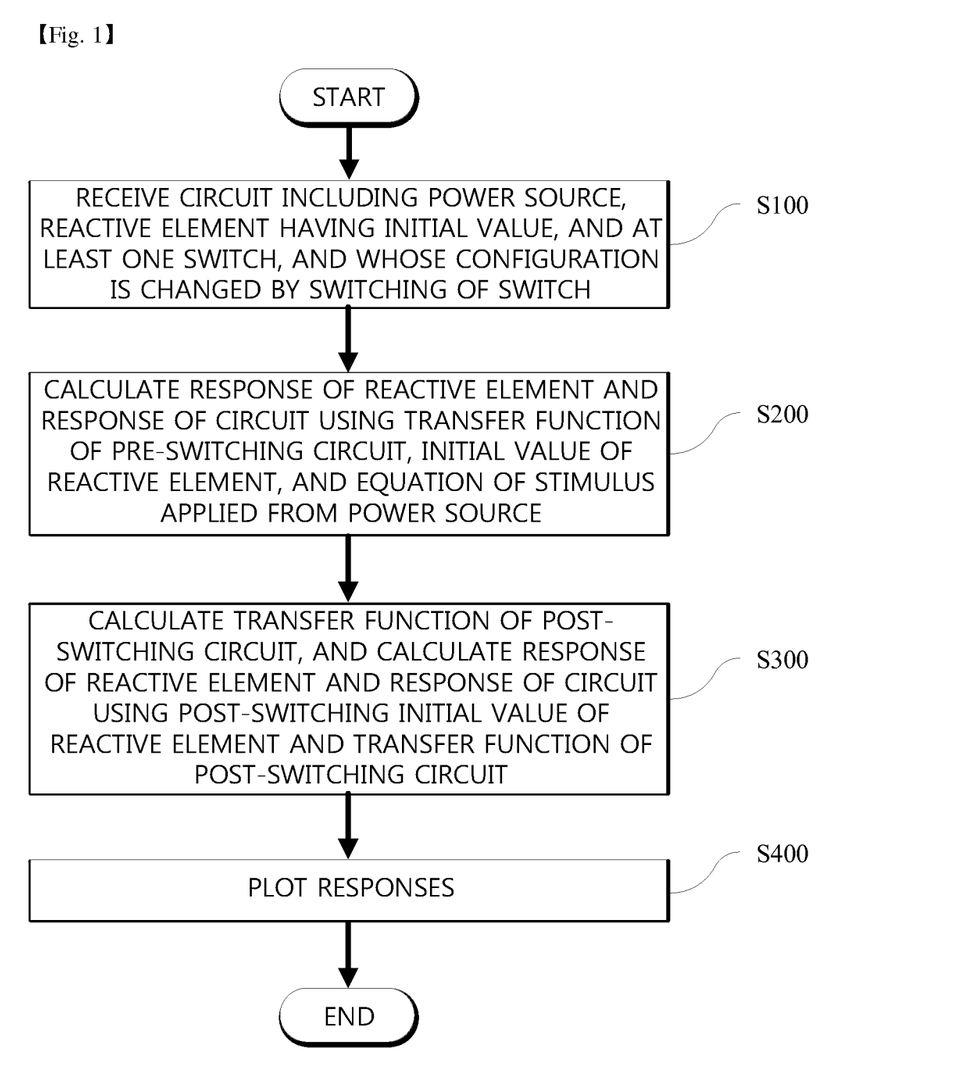
FIG. 1 is a flowchart illustrating an operation according to an exemplary embodiment.

Hereinafter, an exemplary embodiment will be described with reference to the accompanying drawings. FIG. 1 is a flowchart illustrating an operation according to this exemplary embodiment. Referring to FIG. 1, this exemplary embodiment includes receiving an electrical circuit including one or more reactive elements and one or more switches, of which configurations change by switching any of the switches, and a stimulus expressed in a form of a linear combination of one or more basis functions (S100), calculating a response of the electrical circuit before the switching in a form of a linear combination of one or more basis functions, using an s-domain transfer function of the electrical circuit before the switching, initial values of the reactive elements before the switching, and the stimulus expressed in a form of a linear combination of one or more basis functions (S200), and calculating a response of the electrical circuit after the switching in a form of a linear combination of one or more basis functions, using an s-domain transfer function of the electrical circuit after the switching and initial values of the reactive elements after the switching (S300). As an example, after S300, this exemplary embodiment may further include plotting the response graphically by evaluating the expression of the response in a form of a linear combination of one or more basis functions at one or more time points (S400).

Referring to S100 of FIG. 1, an electrical circuit that includes one or more reactive elements and one or more switches, of which configurations change by switching any of the switches, is input by a user. In an exemplary embodiment, the electrical circuit input by the user may be an analog circuit, a digital circuit, and/or a mixed-signal circuit. When the electrical circuit input by the user is a digital circuit, there is a known method of calculating the output response using an event-driven method. However, when the electrical circuit is an analog circuit or mixed-signal circuit, no known method for its purely event-driven simulation exists. The following description will be made assuming that the user inputs an electrical circuit shown in FIG. 2 to include one switch and energy-storing elements of an inductor L and a capacitor C, and intends to obtain a response Vout. A node N of the switch is initially connected to a node 1 and switches over to a node 2 at a predetermined interval.

In general, the form of an input stimulus used in an electrical circuit simulation may be a step function, a ramp function, an exponential function, an exponential function multiplied by a polynomial function, and any combination thereof, to name a few possibilities. These possible input stimulus waveforms can be collectively expressed using Equation 1 below. In other words, Equation 1 can be a step function when m=1 and a=0, an exponential function when m=1, and a ramp function when a=0 and m=2, for instance. Equation 1 can express many forms of signal functions that are meaningful in engineering. A stimulus having such a form may be applied to the circuit in the form of current or voltage.

A function listed as Equation 1 is defined as a basis function, and a response of the electrical circuit to the stimulus having a form of a linear combination of one or more basis functions will be found below, where the coefficients c, m, and a are complex-valued in general.

$$ct^{(m-1)}e^{(-at)}u(t), \quad \text{[Equation 1]}$$
$$u(t) = 1 \text{ for } t \geq 0,$$
$$0 \text{ elsewhere}$$

And this invention expresses both the input stimulus and output response of an electronic circuit or system x(t) in forms of a linear combination of one or more basis functions as shown below:

$$x(t) = \sum_i c_i t^{m_i-1} e^{-a_i t} u(t)$$

Hence, the set of coefficients $\{c_i\}$'s, $\{a_i\}$'s, and $\{m_i\}$'s define a continuous-time signal waveform x(t) as a function of time t for t≥0. Note that the unit step function u(t) in Equation 1 is mainly to indicate that the above functional expression for x(t) is valid only for the time after the set of coefficients $\{c_i\}$'s, $\{a_i\}$'s, and $\{m_i\}$'s are updated. Throughout this disclosure, it is implicitly assumed that the coefficients are updated with new values at t=0, and hence the above functional expression is valid only for t≥0. However, during the course of simulation, the coefficients may change in subsequent times, e.g. at t=$t_0$, in which case the above functional expression must be interpreted with a proper time shift $t_0$:

$$x(t) = \sum_i c_i (t-t_0)^{m_i-1} e^{-a_i(t-t_0)} u(t-t_0)$$

which is valid for $t \geq t_0$.

In S200, the response of the electrical circuit before the switching in a form of a linear combination of one or more basis functions is calculated using an s-domain transfer function of the electrical circuit before the switching, initial values of the reactive elements before the switching, and the stimulus expressed in a form of a linear combination of one or more basis functions. To obtain an s-domain equation for the input stimulus, a Laplace transform is performed on the stimulus in a form of a linear combination of one or more basis functions. The Laplace transform is defined as Equation 2 below. As the conversion of a function defined in the time domain into a function defined in the s-domain, Laplace transform facilitates a simple computation of the output response of an electrical circuit given its input stimulus.

$$F(s) = \int_0^\infty f(t)e^{-st}dt \qquad \text{[Equation 2]}$$

Table 1 lists the Laplace transform of a few common functions. When the user applies a ramp function or an exponential function as a stimulus, the two stimuli have very different forms in the time-domain expressions, but their Laplace-transforms are both in the partial-fraction expansion forms and different only in the coefficient values. In general, any time-domain signal expressed in a form of a linear combination of one or more basis functions in Equation 1 transforms to a partial fraction expansion form in s domain.

TABLE 1

| $ct^{(m-1)}e^{(-at)}u(t)$ | $\dfrac{b}{(s+a)^m}$ |
|---|---|
| $cu(t)$ | $\dfrac{b}{s}$ |
| $ctu(t)$ | $\dfrac{b}{s^2}$ |
| $ce^{(-at)}u(t)$ | $\dfrac{b}{s+a}$ |
| $cte^{(-at)}u(t)$ | $\dfrac{b}{(s+a)^2}$ |

(where a, b, and c all are complex-valued constants)

In S200, the s-domain transfer function of the electrical circuit is defined as below. Given a linear system of which input stimulus x(t) and output response y(t) have Laplace transforms of X(s) and Y(s), respectively, its s-domain transfer function H(s) is defined as the ratio between Y(s) and X(s) as in Equation 3. In other words, the s-domain transfer function H(s) denotes a ratio of the Laplace-transformed output response Y(s) to the Laplace-transformed input stimulus X(s).

$$H(s) \equiv \frac{Y(s)}{X(s)} \qquad \text{[Equation 3]}$$

The s-domain transfer function of an electrical circuit can be obtained as follows. In an exemplary embodiment, the user may form and input the circuit in a simulation tool by disposing icons representing elements and connecting the disposed icons on a graphical user interface, or by designating nodes of the circuit and specifying elements connected between the nodes in a textual form. From the said circuit input, the simulation tools may extract the structural netlists defining the elements constituting the circuit and the connections among the elements, and form a differential equation or an equivalent model representing the circuit. The s-domain transfer function H(s) can be obtained by transforming the differential equation or equivalent model into the Laplace s-domain or by solving the s-domain equivalent circuit model of the electrical circuit.

Figure 2:
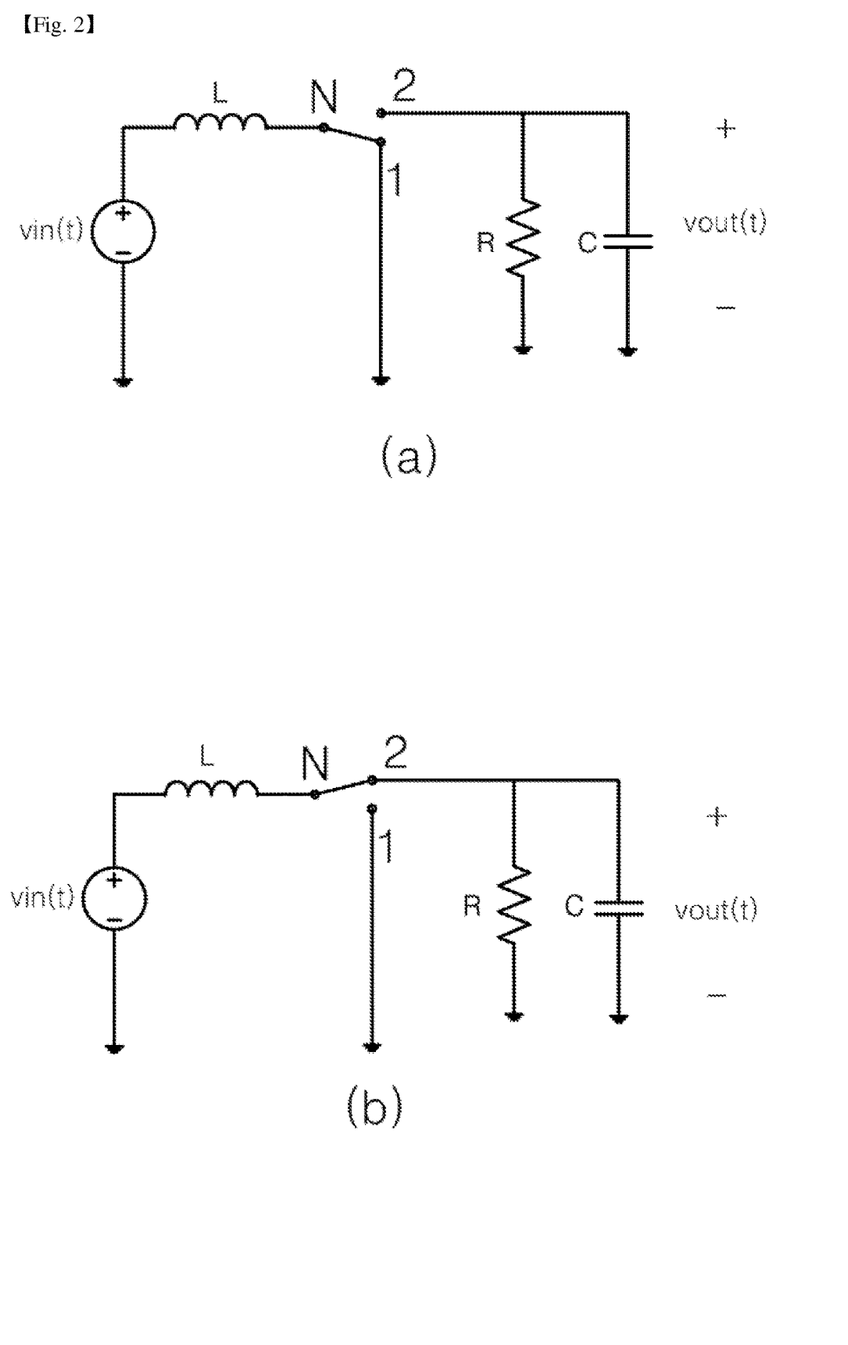
FIG. 2 shows diagrams exemplifying a circuit input by a user.

An example illustrates how a differential equation representing an electrical circuit can be formed from an extracted netlist. (a) of FIG. 2 shows an electrical circuit circuit before the switch switching. Referring to (a) of FIG. 2, the following differential equations are established at the individual nodes of the electrical circuit:

$$\begin{cases} \dfrac{dv_c(t)}{dt} = \dfrac{-1}{RC}v_c(t) \\ \dfrac{di_L(t)}{dt} = \dfrac{1}{L}v_{IN}(t) \\ v_{out}(t) = v_c(t) \end{cases}$$

And Laplace transforming these differential equations governing the output voltage Vout and capacitor voltage $v_C$ results in the following s-domain equations in Equation 4:

$$\begin{cases} V_C(s) = 0 \times V_{IN}(s) + \dfrac{RC}{RCs+1}v_{c(0)} + 0 \times i_L(0) \\ I_L(s) = \dfrac{1}{sL}V_{IN}(s) + 0 \times v_C(0) + \dfrac{1}{s}i_L(0) \\ V_{OUT}(s) = V_C(s) \end{cases} \qquad \text{[Equation 4]}$$

Figure 3:
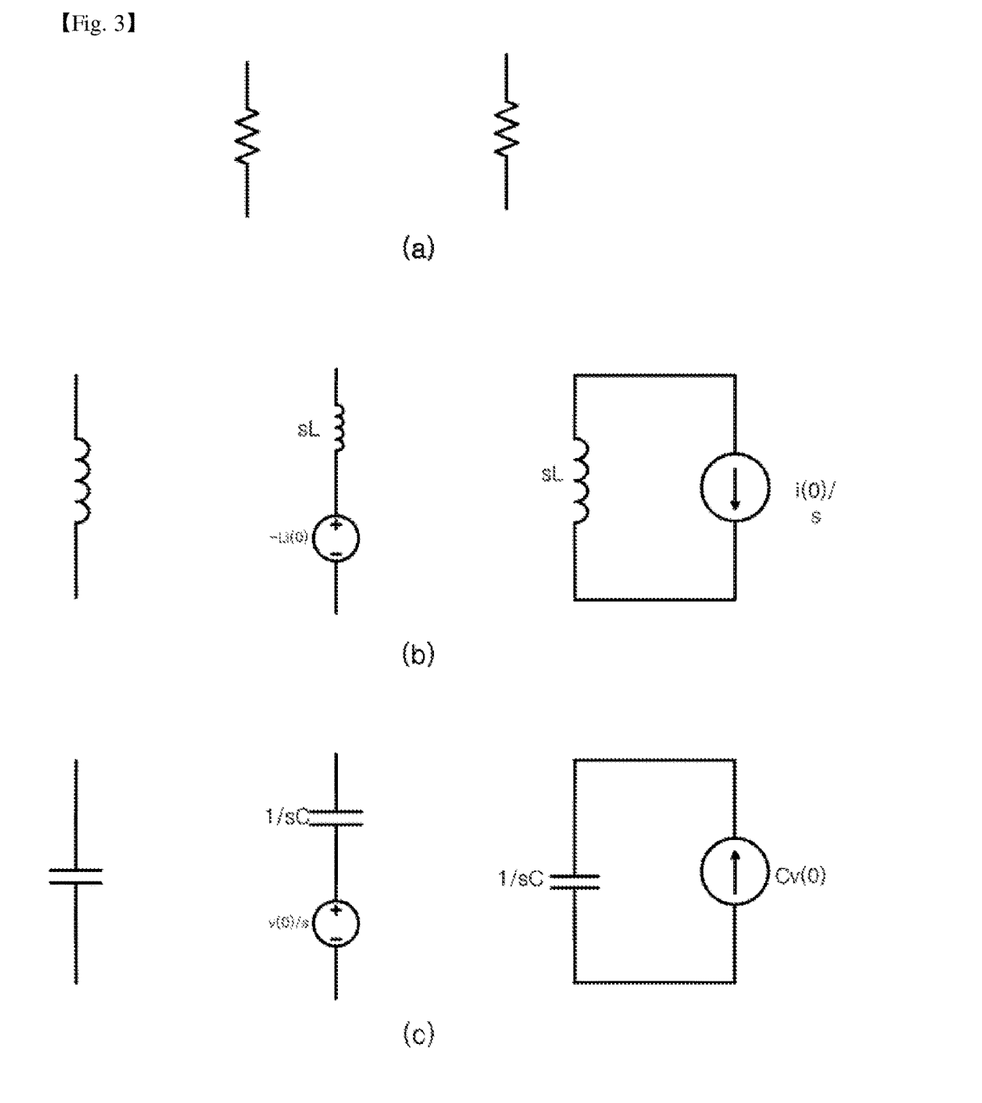
FIG. 3 shows the s-domain equivalent circuits of a resistor, an inductor, and a capacitor.

Another example illustrates how the s-domain transfer function can be alternatively derived by solving the s-domain equivalent circuit model. FIG. 3 lists the s-domain equivalent expressions for the time-domain current-voltage equations for a resistor R, an inductor L, and a capacitor C, which are the passive elements used in analog circuits. Referring to (a) of FIG. 3, a resistor has an s-domain impedance Z(s)=V(s)/I(s) equal to R, where R is the resistance. Referring to (b) of FIG. 3, an inductor with an inductance L has an s-domain impedance of sL, of which initial current value i(0) may be indicated either with a voltage source having an initial voltage of Li(0) or with a current source having an initial current of i(0)/s. Likewise, referring to (c) of FIG. 3, a capacitor with a capacitance C has an s-domain impedance of 1/sC, of which initial voltage value v(0) may be indicated as a voltage source of v(0)/s or a current source of Cv(0).

Figure 4:
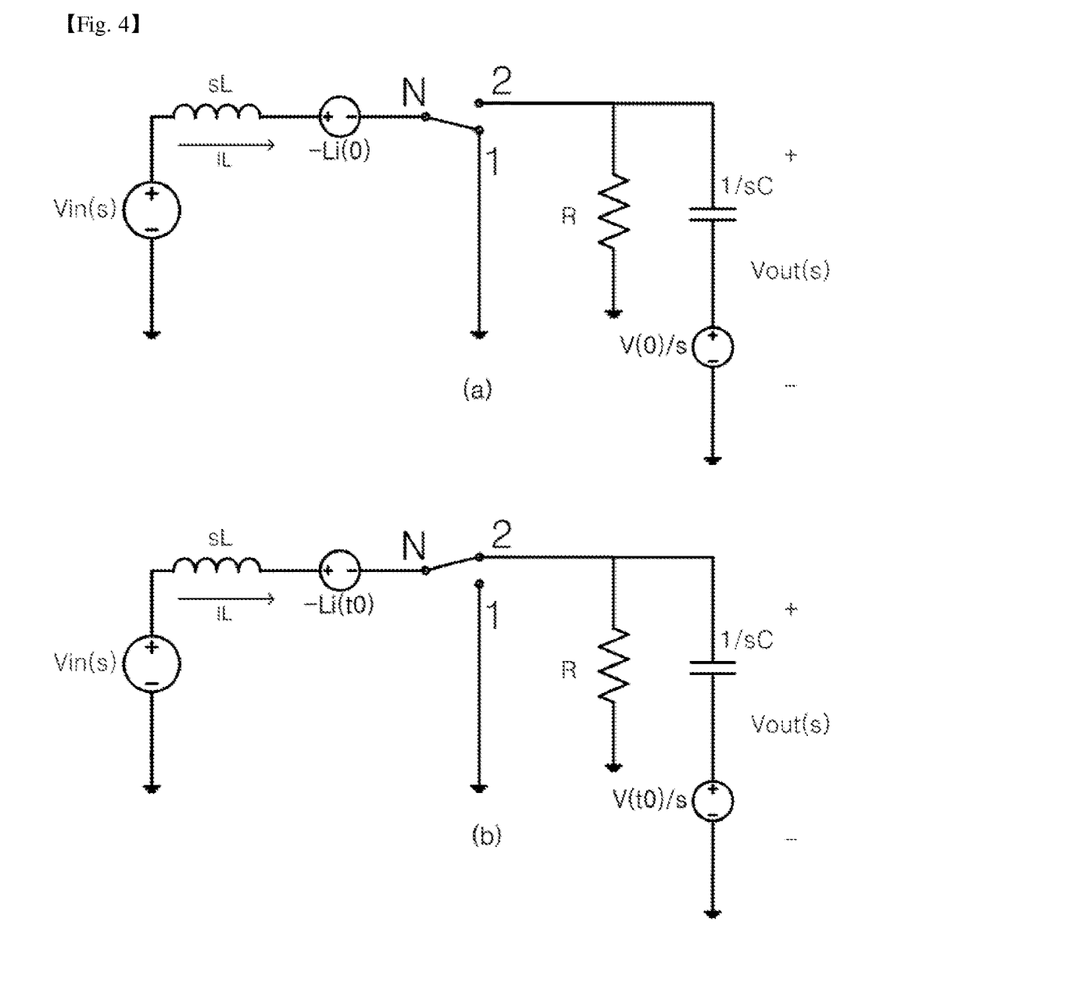
FIG. 4 shows an s-domain equivalent circuit of a circuit input by a user.

Based on the above-described results, an s-domain equivalent circuit of the exemplary circuit in FIG. 2 can be derived as shown in FIG. 4, and using the s-domain equivalent circuit, the s-domain equations governing the current of the inductor $I_L(s)$, voltage of the capacitor $V_C(s)$, and the output voltage Vout are found as shown in Equation 4. It is possible to obtain the same transfer function using any of the above methods.

Referring to the electrical circuit of (a) of FIG. 2 input by the user and Equation 4, it is possible to derive various s-domain transfer functions. For instance, an s-domain transfer function of the voltage $V_C(s)$ of the capacitor with respect to the initial value $v_C(0)$ of the capacitor can be derived as $$\frac{V_C(s)}{v_C(0)} = \frac{RC}{sRC+1}.$$

In addition, an s-domain transfer function of the current $I_L(s)$ of the inductor with respect to the input voltage stimulus $V_{IN}(s)$ is $$\frac{I_L(s)}{V_{IN}(s)} = \frac{1}{sL},$$

and an s-domain transfer function of the current $I_L(s)$ of the inductor with respect to the initial value $i_L(0)$ of the inductor is $$\frac{I_L(s)}{i_L(0)} = \frac{1}{s}.$$

In general, one can derive the s-domain transfer functions with respect to the stimulus and s-domain transfer functions with respect to the initial values of the reactive elements from an electrical circuit.

These s-domain transfer functions can be used for simulating the electrical circuit in the following way. When the electrical circuit shown in FIG. 2 switches from one of the two configurations shown in (a) of FIG. 2 and (b) of FIG. 2 to the other, it is possible to compute the s-domain equation of the capacitor voltage by merely multiplying the s-domain transfer function with respect to the initial value of the capacitor and the capacitor voltage value immediately after the switching. Also, it is possible to compute the s-domain equation of the inductor current by multiplying the s-domain transfer function with respect to the stimulus and the s-domain equation of the stimulus, multiplying the s-domain transfer function with respect to the initial value of the inductor and the current value of the inductor immediately after switching, and summing the two multiplication results.

As an example, when a unit step function is applied as the stimulus, the aforementioned equations in Equation 4 become those with $V_{IN}(s)=1/s$ since $1/s$ is a Laplace transform of a unit-step waveform. By performing an inverse Laplace transform on Equation 4, Equation 5 below can be obtained.

$$\begin{cases} v_C(t) = v_C(0)e^{\frac{-1}{RC}t}u(t) \\ i_L(t) = \left(\frac{t}{L} + i_L(0)\right)u(t) \\ v_{OUT}(t) = v_C(t) \end{cases} \quad \text{[Equation 5]}$$

Consequently, it is possible to obtain the equations of the current $i_L$ of the inductor, the voltage $v_C$ of the capacitor, and the response $v_{OUT}$ to be obtained in connection with the time period from the operation start of the circuit to immediately before the switching.

Referring to S300 of FIG. 1, a response of the electrical circuit after the switching in a form of a linear combination of one or more basis functions is calculated, using an s-domain transfer function of the electrical circuit after the switching and initial values of the reactive elements after the switching. In an exemplary embodiment, referring to (b) of FIG. 2, the switch switches over to electrically connect the node N to the node 2, and the circuit is transformed to a new configuration. From the response calculated with Equation 5, the initial values of the reactive elements is calculated in the changed state of the switch as shown in (b) of FIG. 2. In other words, when switching is performed at $t=t_0$, the value $i_L(t_0^-)$ of current flowing through the inductor immediately before the switching is the same as a value $i_L(t_0^+)$ immediately after the switching. Also, the voltage value $v_C(t_0^-)$ at the both ends of the capacitor immediately before the switching is the same as the voltage value $v_C(t_0^+)$ immediately after the switching. Using such a relationship, it is possible to calculate the initial current value $i_L(t_0^+)$ and the initial voltage value $v_C(t_0^+)$ of the reactive elements. It is assumed below that switching is performed at $t=t_0$.

Since the response indicated by Equation 4 and Equation 5 cannot be a response of the new circuit formed through switching over of the switch, a response of the newly transformed circuit is calculated. A process of calculating the response of the new circuit is the same as the process of calculating the response by Laplace transforming the differential equation or by transforming the circuit into the s-domain equivalent circuit before the switching over of the switch, and thus will be omitted for brief and clear description. The capacitor voltage response, the inductor current response, and the output response obtained through the above-described process are found as shown in Equation 6 below.

$$V_C(s) = \frac{1}{LCs^2 + \frac{L}{C}s + 1}V_{IN}(s) + \quad \text{[Equation 6]}$$

$$\frac{LCs}{LCs^2 + \frac{L}{C}s + 1}v_C(t_0) + \frac{L}{LCs^2 + \frac{L}{C}s + 1}i_L(t_0)$$

$$I_L(s) = \frac{\frac{1}{R} + sC}{LCs^2 + \frac{L}{C}s + 1}V_{IN}(s) + \frac{-C}{LCs^2 + \frac{L}{C}s + 1}v_C(t_0) +$$

$$\frac{\frac{L}{R} + sLC}{LCs^2 + \frac{L}{C}s + 1}i_L(t_0)$$

$$V_{OUT}(s) = V_C(s)$$

Therefore, all the s-domain responses calculated as above generally have a form in which three terms are superposed. The first term of the responses is in accordance with the input stimulus $V_{IN}$ applied to the circuit, and the second and third terms are in accordance with the initial value $V_C(t_0)$ of the capacitor and initial value $I_L(t_0)$ of the inductor, respectively. In other words, the response of the whole circuit has a form in which the response to the applied stimulus and responses to the initial values of the reactive elements are linearly superposed. As described above, these responses correspond to a linear superposition of the product of the s-domain equation of the stimulus and the s-domain transfer function with respect to the stimulus, the product of the initial voltage value of the capacitor and the s-domain transfer function with respect to the initial value of the capacitor, and the product of the initial current value of the inductor and the s-domain transfer function with respect to the initial current value of the inductor.

Likewise, as described above, when switching is performed in sequence, the capacitor voltage is represented by the product of the s-domain equation of the stimulus and the s-domain transfer function with respect to the stimulus, the product of the initial voltage value of the capacitor and the s-domain transfer function with respect to the initial value of the capacitor, and the product of the initial current value of the inductor and the s-domain transfer function with respect to the initial current of the inductor, and the inductor current is represented by the product of the s-domain equation of the stimulus and the s-domain transfer function with respect to the stimulus, the product of the initial voltage value of the capacitor and the s-domain transfer function with respect to the initial voltage value of the capacitor, and the product of the initial current value of the inductor and the s-domain transfer function with respect to the initial current value of the inductor.

In other words, when the switch is connected to the node 2, it is possible to calculate the capacitor voltage, inductor current, and output voltage of the circuit not by using a numerical integration method that is complex and requires a long time but by using the s-domain equation of the stimulus, the capacitor voltage value $v_C(t_o^+)$, and the inductor current value $i_L(t_o^+)$ calculated upon switching.

The responses of Equation 6 represented in the s-domain are converted into the time domain in a form of a linear combination of one or more basis functions. In an exemplary embodiment, a term of an expression represented in the s domain may be separated into two or more terms through partial fraction decomposition. An equation for expanding a term that is the product of a transfer function and a stimulus into partial fractions is represented in the most general form as shown in Equation 7 below.

[Equation 7]

$$\sum_i \frac{b_i}{(s+a_i)^{m_i}} \times \sum_j \frac{q_j}{(s+p_j)^{n_j}} =$$

$$\sum_{i,j} \frac{b_i}{(s+a_i)^{m_i}} \times \frac{q_j}{(s+p_j)^{n_j}} = \sum_{i,j} \left( \sum_{k=1}^{m_i} \frac{c_k}{(s+a_i)^k} + \sum_{l=1}^{n_j} \frac{d_l}{(s+p_j)^l} \right)$$

where, $$c_k = \begin{cases} \frac{b_i \cdot q_j}{(p_j - a_i)^{n_j}}, & \text{for } k = m_i \\ \frac{b_i \cdot q_j}{(p_j - a_i)^{m_i + n_j - k}} \cdot \frac{(-1)^{m_i - k}}{(m_i - k)!} \cdot \\ \prod_{z=i}^{m_i - 1} (m_i + n_j - 1 - z), & \text{for } k = m_i - 1, \ldots, 1 \end{cases}$$

$$d_l = \begin{cases} \frac{b_i \cdot q_j}{(a_i - p_j)^{m_i}}, & \text{for } l = n_j \\ \frac{b_i \cdot q_j}{(a_i - p_j)^{n_j + m_i - l}} \cdot \frac{(-1)^{n_j - l}}{(n_j - l)!} \cdot \\ \prod_{z=i}^{n_j - 1} (n_j + m_i - 1 - z), & \text{for } l = n_j - 1, \ldots, 1 \end{cases}$$

where $b_i$, $q_j$, $c_k$, and $d_l$ are complex-valued numbers.

The output vout(t) of the circuit, voltage $v_C(t)$ of the capacitor, and current $i_L(t)$ of the inductor may be separated into partial fractions by the above equation. When an inverse Laplace transform is performed on the calculation result divided into partial fractions, it is possible to find a target response in a form of a linear combination of one or more basis functions.

When switching occurs at $t=t_1$ and the node N is connected with the node 1, the calculation result obtained by substituting t with $t_1$ in the time-domain response is used as the initial value of a new response. At this time, it is possible to obtain the new response by simply multiplying the relational expression of the s-domain transfer functions obtained in Equation 4 and newly calculated initial values, and no further calculation is necessary to obtain the response.

In an exemplary embodiment, the output response may be plotted graphically by evaluating the obtained functional expression for the response at one or more time points. In other words, using the set of coefficients $\{c_i\}$'s, $\{a_i\}$'s, and $\{m_i\}$'s constituting the functional expression in a form of a linear combination of one or more basis functions, a waveform plotting tool can compute the output response waveform at an arbitrary time point as necessary to display the waveform with a desired quality. This is in contrast to prior arts where a waveform plotting tool cannot compute the output response waveform at time points other than those provided by the simulation results, without resorting to some approximating methods such as interpolation or estimation.

The method of simulating an electrical circuit using the event-driven method according to this embodiment may be implemented as a computer program to be executed on a computer. In particular, the method may be executed in the context of Verilog, SystemVerilog, very high speed integrated circuit (VHSIC) hardware description language (VHDL) simulators which are the programs for simulating digital circuits and systems using an event-driven method.

A comparison will be made with related art in comparative examples below.

COMPARATIVE EXAMPLE

Figure 5:
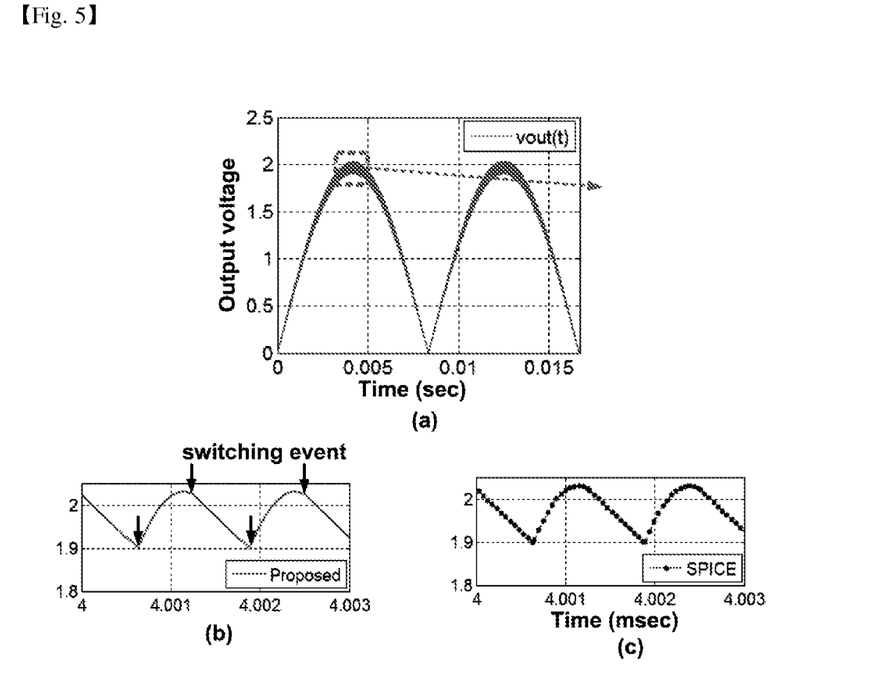
FIG. 5 is a diagram for comparison between results of a circuit simulation employing this embodiment and results of a circuit simulation employing a commercial circuit simulation program.

FIG. 5 is a diagram for a comparison between the circuit simulation results simulated by this embodiment and the circuit simulation results simulated by a commercial circuit simulation program. As a simulation condition, a full-wave-rectified alternating current (AC) signal with a frequency of 60 Hz was input to an input terminal of the circuit shown in FIG. 2, and then the switch was turned on or off at periods of 0.5 μsec. (a) of FIG. 5 is a diagram showing the voltage Vout at an output terminal, and (b) and (c) of FIG. 5 are enlarged views of a portion of a square box shown in (a) of FIG. 5. (b) of FIG. 5 shows simulation results of this embodiment, and (c) of FIG. 5 shows simulation results of simulation program with integrated circuit emphasis (SPICE) which is a commercial program.

As shown in (b) and (c) of FIG. 5, the results of the two simulations match each other. For a simulation of a total period of 0.1 seconds with a time step of 100 ns, the simulation employing this embodiment took a total of 8.2 seconds, while the simulation employing SPICE took a total of 920.5 seconds. In addition, when a 100-ns time step is decreased to 10 μsec by a factor of 10,000, the total simulation time employing this embodiment increased by 15% from 8.2 seconds to 9.4 seconds, while the total simulation time employing SPICE increased by 15,000% or more.

Figure 6:
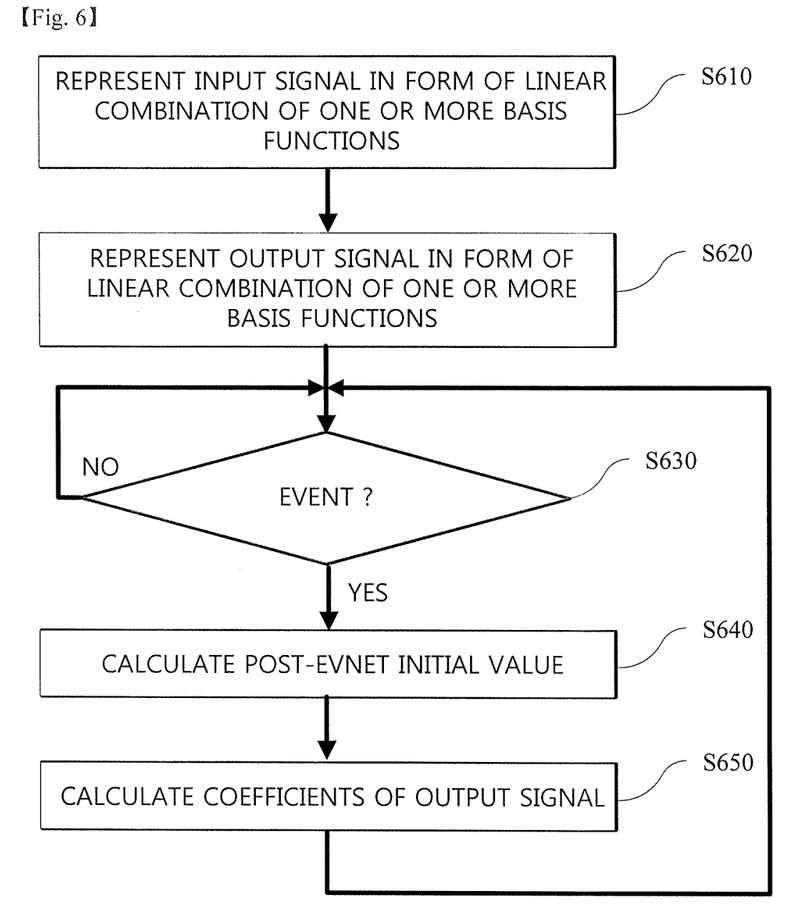
FIG. 6 is a flowchart illustrating a method of simulating an electrical circuit switching between two or more dynamical system characteristics.

FIG. 6 is a flowchart illustrating the disclosed event-driven simulation method for an electrical circuit switching between two or more dynamical system characteristics. Here, the electrical circuit may include at least one of a resistor, a capacitor, an inductor, a voltage source, and a current source, and at least one switch. An input stimulus of the electrical circuit may be expressed in a form of a linear combination of one or more basis functions, and the coefficients of the respective basis functions may change over time. An s-domain transfer function of the electrical circuit may change according to an operation of the switch. In other words, the electrical circuit may switch between two or more dynamical system characteristics according to an operation of the switch. For example, when the electrical circuit has two dynamical system characteristics (first and second dynamical system characteristics), the electrical circuit may switch from the first dynamical system characteristic to the second dynamical system characteristic by an operation of the switch, and may switch from the second dynamical system characteristic to the first dynamical system characteristic by an additional operation of the switch. Within a period that starts after the electrical circuit switches to one dynamical system characteristic and ends before the dynamical system switches to another dynamical system characteristic, the electrical circuit has a linear characteristic.

Referring to FIG. 6, an input stimulus (e.g., a current source or a voltage source) of the electrical circuit is represented in the form of a linear combination of one or more basis functions (S610).

For example, the linear combination of one or more basis functions may be represented as Equation 8 in time-domain and represented as Equation 9 in s-domain. Equation 8 and 9 implicitly assume that the coefficients are changed at t=0 and are valid since then. In case the coefficients are updated at a time other than 0, e.g. at t=$t_0$, the time-domain and s-domain equations can be adjusted to Equation 10 and Equation 11, respectively, each of which is valid for t≥$t_0$. For simplicity and without loss of generality, this disclosure will assume that the coefficients are last updated at t=0 and use Equation 8 and 9 to explain the embodiment.

$$\sum_i c_i t^{(m_i-1)} e^{-a_i t} u(t) \qquad \text{[Equation 8]}$$

(where $c_i$, $m_i$, and $a_i$ are complex numbers)

$$\sum_i \frac{b_i}{(s+a_i)^{m_i}} \qquad \text{[Equation 9]}$$

(where $b_i$, $a_i$, and $m_i$ are complex numbers, and $b_i = c_i (m_i-1)!$)

$$\sum_i c_i (t-t_o)^{(m_i-1)} e^{-a_i(t-t_o)} u(t-t_o) \qquad \text{[Equation 10]}$$

(where $c_i$, $m_i$, and $a_i$ are complex numbers)

$$\sum_i e^{-t_o s} \frac{b_i}{(s+a_i)^{m_i}} \qquad \text{[Equation 11]}$$

(where $b_i$, $a_i$, and $m_i$ are complex numbers, and $b_i = c_i (m_i-1)!$)

The present invention also represents the response of the electrical circuit to the said stimulus in the form of a linear combination of one or more basis functions (S620). For example, in order to represent the output response in the form of a linear combination of one or more basis functions, the electrical to be simulated is modeled as an s-domain transfer function. For example, the s-domain transfer function of the electrical circuit can be represented in a partial fraction expansion form shown in Equation 12. Subsequently, the s-domain equation for the response is computed by multiplying the s-domain equation for the stimulus and the s-domain transfer function. By performing partial fraction decomposition on the individual product terms, the s-domain equation for the output response can also take a partial fraction expansion form. This process is equivalent to Equation 7, and thus will be omitted for the convenience of description. Subsequently, an inverse Laplace transform is performed on the result of the multiplication and partial fraction decomposition to find the time-domain equation for the response. The resulting response takes a form of a linear combination of basis functions of Equation 13 with the appropriate coefficient values.

$$\sum_j \frac{q_j}{(s+p_j)^{n_j}} \qquad \text{[Equation 12]}$$

(where $q_j$, $p_j$, and $n_j$ are complex numbers)

As one example, it is possible to perform operation S610 and operation 620 symbolically rather than entirely numerically. For instance, while performing the operation S610 and operation S620, symbolic, algebraic equations describing the coefficients of the output response expression as functions of the coefficients of the input stimulus expression can be derived. An advantage of describing such symbolic, algebraic equations is that it becomes unnecessary to perform the operation S610 and operation S620 to compute the output response every time the coefficients of the input stimulus change (i.e. the input event occurs). Instead, the coefficients of the output response can be computed simply by evaluating the symbolic, algebraic expressions with the updated input coefficients. As another example, when operation S610 and operation S620 are performed, the coefficients of the input stimulus may be represented as numerical values. As an example, when operation S620 is performed, the initial value of a reactive element (e.g., an inductor or a capacitor) may be represented in the form of either a symbolic variable or a numerical value, like the coefficients of the input stimulus. From now, the coefficients of the output response expressed as functions of the coefficients of the input stimulus and the initial values of the reactive elements are simply referred to as functional-form output coefficients for the convenience of description.

As an example, when operation S620 is performed, functional-form output coefficients corresponding to a plurality of dynamical system characteristics may be found in advance. For example, when the electrical circuit includes one switch and switches between two dynamical system characteristics (first and second dynamical system characteristics) by an operation of the one switch, first functional-form output coefficients corresponding to the first dynamical system characteristic and second functional-form output coefficients corresponding to the second dynamical system characteristic may be found in advance. When a plurality of functional-form output coefficients corresponding to the plurality of dynamical system characteristics are found in advance, it is possible to easily find the output response by substituting numerical values for the coefficients of the input stimulus and the initial values of the reactive elements without calculating the s-domain transfer function to find the output response every time the switch operates. As another example, when operation S620 is performed, only functional-form output coefficients corresponding to a current dynamical system characteristic may be found, and then only an output response corresponding to the current dynamical system characteristic may be found. As another example, when operation S620 is performed, an s-domain transfer function corresponding to the current dynamical system characteristic may be found using numerical values of the coefficients of the input stimulus and numerical value of the initial values of the reactive elements, and then only an output response corresponding to the current dynamical system characteristic may be found.

It is determined whether or not an event occurs, that is, whether or not the switch has operated or the coefficients of the input stimulus are changed (S630). In other words, it is determined whether or not the switch included in the electrical circuit has operated or whether or not the numerical value of at least one of the coefficients ($c_i$, $m_i$, $a_i$) of the input response expressed in a form of a linear combination of one or more basis functions is changed.

When an event occurs, initial values of the reactive elements after the switching are calculated (S640). The initial values after the switching may be found by evaluating the time-domain expression for the output response before the switching at the time of the switching.

The coefficients of the output response expressed in a form of a linear combination of one or more basis functions are calculated (S650). When functional-form output coefficients have been calculated in advance, it is possible to easily find the output response by substituting numerical values for the coefficients of the input stimulus and substituting the numerical value found in operation S640 for the initial values of the reactive elements. For example, when an event of changes in one or more of the coefficients of the input stimulus occurs, the output response may be calculated by substituting numerical values for the coefficients of the input stimulus and substituting numerical values for initial values of the reactive elements. For example, when an event of an operation of the switch occurs, the output response may be calculated by substituting numerical values for the coefficients of the input stimulus and the initial values of the reactive elements in connection with functional-form output coefficients after the switching. Here, the functional-form output coefficients after the switching denote, for example, functional-form output coefficients corresponding to the second dynamical system characteristic when the first dynamical system characteristic is switched to the second dynamical system characteristic by a switching operation. When no functional-form output coefficients have been calculated in advance, the output response may be calculated in s-domain using the numerical values of the coefficients of the input stimulus and the s-domain transfer function including the initial values after the switching calculated in operation S640. The calculation may include an operation of multiplying the numerical values of the coefficients of the input stimulus and the s-domain transfer function including the initial values after the switching, an operation of obtaining the output response represented in the form of a linear combination of one or more basis functions by performing partial fraction decomposition of the result of multiplication, and an operation of performing an inverse Laplace transform on the result of partial fraction expansion. When no functional-form output coefficients after the switching operation have been calculated in advance, the output response may be found by, for example, finding functional-form output coefficients like in operation S620 and then substituting numerical values for the coefficients of the input stimulus and the initial values of the reactive elements. For example, when the first functional-form output coefficients corresponding to the first dynamical system characteristic are found in operation S620 and the electrical circuit switches to the second dynamical system characteristic in operation S630, the second functional-form output coefficients corresponding to the second dynamical system characteristic are found, and the output response is found by substituting numerical values for the coefficients of the input stimulus and the initial values of the reactive elements in operation S650. Subsequently, when the electrical circuit switches to the first dynamical system characteristic in operation S630, the output response may be found by simply substituting numerical values for the coefficients of the input stimulus and the initial values of the reactive elements because the first functional-form output coefficients have been already found in operation S620. Subsequently, when the electrical circuit switches to the second dynamical system characteristic in operation S630, the output response may be found by simply substituting numerical values for the coefficients of the input stimulus and the initial values of the reactive elements because the second functional-form output coefficients have been already found in operation S650.

After operation S650 is performed, every time an event occurs (S630), the initial values of the reactive elements after the switching are calculated (S640), and the coefficients of the output response expressed in a form of a linear combination of one or more basis functions are calculated (S650).

While the invention has been shown and described with reference to certain exemplary embodiments thereof, it will be understood by those of ordinary skill in the art that various changes in form and details may be made therein without departing from the spirit and scope of the invention as defined by the appended claims.

The invention claimed is:

1. An event-driven method of simulating an electrical circuit using a computer, the method comprising:

receiving, in the computer, an electrical circuit including one or more reactive elements and one or more switches, of which configurations change by switching any of the switches, and a stimulus defining a continuous-time waveform expressed in a form of a linear combination of one or more time-domain basis functions each characterized by a set of complex-valued coefficients;

identifying, by the computer, occurrence of a plurality of events each corresponding to a switching of any of the switches or to a change in a coefficient of the stimulus;

for each period of a plurality of periods between two successive events of the plurality of events, determining, by the computer in response to receiving the electrical circuit, a respective response of the electrical circuit in a form of a linear combination of one or more s-domain basis functions, using an s-domain transfer function of the electrical circuit according to a configuration of the switches during the period, initial values of the reactive elements at a start of the period, and the stimulus during the period expressed as an s-domain function in a form of a linear combination of one or more s-domain basis functions each characterized by the set of complex-valued coefficients, wherein the linear combination of the respective response has a first term that is based on the complex-valued coefficients of the stimulus; and displaying, by the computer in response to the determining the respective response of the electrical circuit for each period, a time-domain waveform of the determined respective responses of the electrical circuit for the plurality of periods which are determined according to the determined linear combination of one or more s-domain basis functions of the respective responses of the electrical circuit for the plurality of periods.

2. The method of claim 1, wherein the s-domain transfer function of the electrical circuit for a first period before a switching of any of the switches includes an s-domain transfer function of the electrical circuit before the switching with respect to the stimulus and an s-domain transfer function of the electrical circuit before the switching with respect to each value of the reactive elements.

3. The method of claim 2, wherein the s-domain transfer function of the electrical circuit for a second period after the switching includes an s-domain transfer function of the electrical circuit after the switching with respect to the stimulus and an s-domain transfer function of the electrical circuit after the switching with respect to each value of the reactive elements.

4. The method of claim 1, wherein the determining the respective response of the electrical circuit in a form of a linear combination of one or more s-domain basis functions, using the s-domain transfer function of the electrical circuit according to a configuration of the switches during the period, the initial values of the reactive elements at a start of the period, and the stimulus during the period expressed as the s-domain function in the form of the linear combination of the one or more basis functions each characterized by the set of complex-valued coefficients comprises:

converting the stimulus defining a continuous-time waveform in the form of the linear combination of the one or more time-domain basis functions to the s-domain function characterized by the set of complex-valued coefficients;

determining a sum of products between the initial values of the reactive elements for a first period before a switching of any of the switches and the s-domain transfer functions of the electrical circuit for the first period before the switching with respect to the corresponding values of the reactive elements, and a product between the s-domain function of the stimulus and the s-domain transfer function of the electrical circuit for the first period before the switching with respect to the stimulus; and converting the sum to the respective response of the electrical circuit for the first period before the switching in a form of a first linear combination of one or more basis functions by inverse Laplace transfoimation.

5. The method of claim 4, where the determining the respective response of the electrical circuit in a form of a linear combination of one or more s-domain basis functions, using the s-domain transfer function of the electrical circuit according to a configuration of the switches during the period, the initial values of the reactive elements at a start of the period, and the stimulus during the period expressed as the s-domain function in the form of the linear combination of the one or more basis functions each characterized by the set of complex-valued coefficients comprises:

determining, by the computer, based on a determined respective response of the electrical circuit for the first period before the switching in the form of the first linear combination of the one or more basis functions using the s-domain transfer function of the electrical circuit before the switching, initial values of the reactive elements immediately before the switching;

determining the initial values of the reactive elements for a second period after the switching set equal to the initial values of the reactive elements immediately before the switching as determined based on the first linear combination of one or more basis functions using the s-domain transfer function;

determining a sum of products between the initial values of the reactive elements after the switching and the s-domain transfer functions of the electrical circuit after the switching with respect to the corresponding values of the reactive elements, and a product between the s-domain equation of the stimulus and the s-domain transfer function of the electrical circuit after the switching with respect to the stimulus; and converting the sum to the response of the electrical circuit for the second period after the switching in a form of a second linear combination of one or more basis functions by inverse Laplace transformation.

6. The method of claim 4, wherein the converting the sum to the respective response of the electrical circuit for the first period in a form of a first linear combination of one or more basis functions by inverse Laplace transformation comprises performing partial fraction decomposition of the sum.

7. The method of claim 1, wherein the one or more reactive elements include at least one of a capacitor and an inductor.

8. The method of claim 1, wherein each of the one or more time-domain basis functions are in a form of $c \cdot t^{m-1} e^{-at} u(t)$ where the coefficients c, m, and a are complex-valued constants and u(t) is a unit step function.

9. The method of claim 1, wherein the s-domain transfer function of the electrical circuit according to a configuration of the switches during a first period and the s-domain transfer function of the electrical circuit according to a configuration of the switches during a second period are found by Laplace transforming differential equations representing the electrical circuits before and after the switching of any of the switches between the first and second periods or by using Laplace equivalent circuit models of the electrical circuits before and after the switching.

10. The method of claim 1, further comprising plotting the response graphically by evaluating the expression of the response in a form of a linear combination of one or more basis functions at one or more time points.

11. The method of claim 1, wherein the method is executed by one or more simulation tools and very high speed integrated circuit (VHSIC) hardware description language (VHDL).

12. A non-transitory recording medium storing a circuit simulation program which, when executed on a computer, causes the computer to perform functions comprising:

receiving an electrical circuit including one or more reactive elements and one or more switches, of which configurations change by switching any of the switches, and a stimulus defining a continuous-time waveform expressed in a form of a linear combination of one or more time-domain basis functions each characterized by a set of complex-valued coefficients;

identifying occurrence of a plurality of events each corresponding to a switching of any of the switches or to a change in a coefficient of the stimulus;

for each period of a plurality of periods between two successive events of the plurality of events, determining a respective response of the electrical circuit in a form of a linear combination of one or more s-domain basis functions, using an s-domain transfer function of the electrical circuit according to a configuration of the switches during the period, initial values of the reactive elements at a start of the period, and the stimulus during the period expressed as an s-domain function in a form of a linear combination of one or more s-domain basis functions each characterized by the set of complex-valued coefficients, wherein the linear combination of the respective response has a first term that is based on the complex-valued coefficients of the stimulus; and in response to the determining the respective response of the electrical circuit for each period, determining a time-domain waveform of the determined respective responses of the electrical circuit for the plurality of periods which are determined according to the determined linear combination of one or more s-domain basis functions of the respective responses of the electrical circuit for the plurality of periods.

13. The recording medium of claim 12, wherein the s-domain transfer function of the electrical circuit for a first period before a switching of any of the switches includes an s-domain transfer function of the electrical circuit before the switching with respect to the stimulus and an s-domain transfer function of the electrical circuit before the switching with respect to each value of the reactive elements.

14. The recording medium of claim 13, wherein the s-domain transfer function of the electrical circuit for a second period after the switching includes an s-domain transfer function of the electrical circuit after the switching with respect to the stimulus and an s-domain transfer function of the electrical circuit after the switching with respect to each value of the reactive elements.

15. The recording medium of claim 12, wherein the determining the respective response of the electrical circuit in a form of a linear combination of one or more s-domain basis functions, using the s-domain transfer function of the electrical circuit according to a configuration of the switches during the period, the initial values of the reactive elements at a start of the period, and the stimulus during the period expressed as the s-domain function in the form of the linear combination of the one or more basis functions each characterized by the set of complex-valued coefficients comprises:

converting the stimulus defining a continuous-time waveform in the form of the linear combination of the one or more time-domain basis functions to the s-domain function characterized by the set of complex-valued coefficients;

determining a sum of products between the initial values of the reactive elements for a first period before a switching of any of the switches and the s-domain transfer functions of the electrical circuit for the first period before the switching with respect to the corresponding values of the reactive elements, and a product between the s-domain function of the stimulus and the s-domain transfer function of the electrical circuit for the first period before the switching with respect to the stimulus; and converting the sum to the respective response of the electrical circuit for the first period before the switching in a form of a first linear combination of one or more basis functions by inverse Laplace transformation.

16. The recording medium of claim 15, where the determining the respective response of the electrical circuit in a form of a linear combination of one or more s-domain basis functions, using the s-domain transfer function of the electrical circuit according to a configuration of the switches during the period, the initial values of the reactive elements at a start of the period, and the stimulus during the period expressed as the s-domain function in the form of the linear combination of the one or more basis functions each characterized by the set of complex-valued coefficients comprises:

determining, based on a determined respective response of the electrical circuit for the first period before the switching in the form of the first linear combination of the one or more basis functions using the s-domain transfer function of the electrical circuit before the switching, initial values of the reactive elements immediately before the switching;

determining the initial values of the reactive elements for a second period after the switching set equal to the initial values of the reactive elements immediately before the switching as determined based on the first linear combination of one or more basis functions using the s-domain transfer function;

determining a sum of products between the initial values of the reactive elements after the switching and the s-domain transfer functions of the electrical circuit after the switching with respect to the corresponding values of the reactive elements, and a product between the s-domain equation of the stimulus and the s-domain transfer function, of the electrical circuit after the switching with respect to the stimulus; and converting the sum to the response of the electrical circuit for the second period after the switching in a form of a second linear combination of one or more basis functions by inverse Laplace transformation.

17. The recording medium of claim 15, wherein the converting the sum to the respective response of the electrical circuit for the first period in a form of a first linear combination of one or more basis functions by inverse Laplace transformation comprises performing partial fraction decomposition of the sum.

18. The recording medium of claim 12, wherein the one or more reactive elements include at least one of a capacitor and an inductor.

19. The recording medium of claim 12, wherein each of the one or more time-domain basis functions are in a form of $c \cdot t^{m-1} e^{-at} u(t)$ where the coefficients c, m, and a are complex-valued constants and u(t) is a unit step function.

20. The recording medium of claim 12, wherein the s-domain transfer function of the electrical circuit according to a configuration of the switches during a first period and the s-domain transfer function of the electrical circuit according to a configuration of the switches during a second period are found by Laplace transforming differential equations representing the electrical circuits before and after switching of any of the switches between the first and second periods or by using Laplace equivalent circuit models of the electrical circuits before and after the switching.

21. The recording medium of claim 12, further comprising plotting the response graphically by evaluating the expression of the response in a form of a linear combination of one or more basis functions at one or more time points.

* * * * *